US007482278B1

(12) United States Patent
Ying et al.

(10) Patent No.: US 7,482,278 B1
(45) Date of Patent: Jan. 27, 2009

(54) KEY-HOLE FREE PROCESS FOR HIGH ASPECT RATIO GAP FILLING WITH REENTRANT SPACER

(75) Inventors: Tze-Liang Ying, Hsin-Chu (TW); James (Cheng-Ming) Wu, KaoHsiung (TW); Yu-Hua Lee, Hsinchu (TW); Wen-Chuan Chiang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/247,974

(22) Filed: Feb. 11, 1999

(51) Int. Cl.
*H01L 21/302* (2006.01)

(52) U.S. Cl. ....................... 438/712; 438/723; 438/724; 438/745; 438/757

(58) Field of Classification Search ................ 438/303, 438/745, 757, 756, 706, 724, 723, 719, 692, 438/712, 754
See application file for complete search history.

(56) References Cited

U.S. PATENT DOCUMENTS 5,262,352 A 11/1993 Woo et al. .................... 437/189
5,462,893 A 10/1995 Matsuoka et al. ........... 437/195
5,602,055 A * 2/1997 Nicholls et al. ............. 438/303
5,663,092 A * 9/1997 Lee ........................... 438/253
5,663,578 A * 9/1997 Hsu et al. ..................... 257/66
5,668,065 A * 9/1997 Lin ........................... 438/303
5,731,242 A * 3/1998 Parat et al. .................. 438/586
5,756,396 A 5/1998 Lee et al. .................... 438/622
5,792,703 A * 8/1998 Bronner et al. ............. 438/620
5,807,779 A * 9/1998 Liaw .......................... 438/279
5,814,564 A * 9/1998 Yao et al. .................... 438/734
5,821,594 A * 10/1998 Kasai ......................... 257/410
5,851,890 A * 12/1998 Tsai et al. ................... 438/303
5,858,869 A * 1/1999 Chen et al. .................. 438/597
5,990,009 A * 11/1999 Hsueh et al. ................ 438/689
6,479,341 B1 * 11/2002 Lu ............................ 438/239

* cited by examiner

*Primary Examiner*—Binh X Tran
(74) *Attorney, Agent, or Firm*—Thomas, Kayden, Horstemeyer & Risley

(57) ABSTRACT

A new method of depositing PE-oxide or PE-TEOS. An HDP-oxide is provided over a pattern of polysilicon. An etch back is performed to the deposited HDP-oxide, a layer of plasma-enhanced SiN is deposited. This PE-SiN is etched back leaving SiN spacers on the sidewalls of the poly pattern, further leaving a deposition of HDP-oxide on the top surface of the poly pattern. The profile of the holes within the poly pattern in such that the final layer of PE-oxide or PE-TEOS is deposited without resulting in the formation of keyholes in this latter layer.

24 Claims, 3 Drawing Sheets

52 52
70 70 70 70
8
54 20 54 20 54

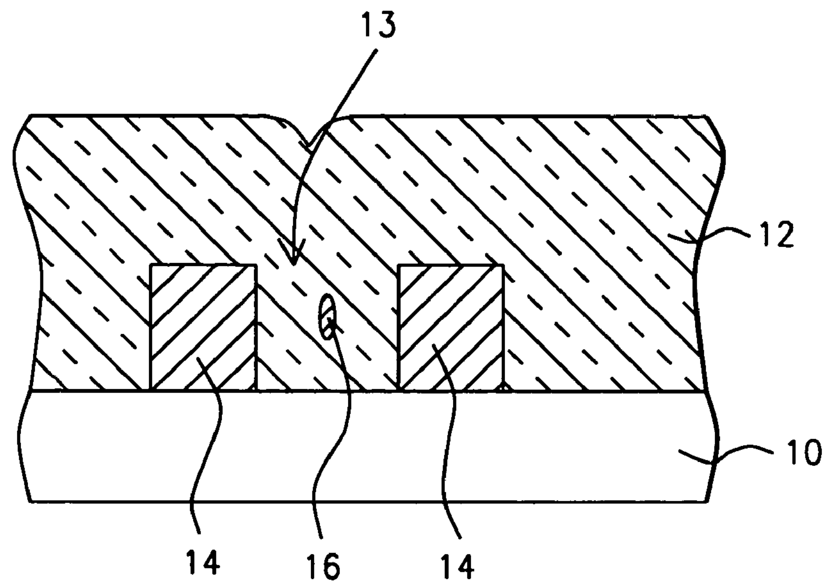
*FIG. 1 – Prior Art*
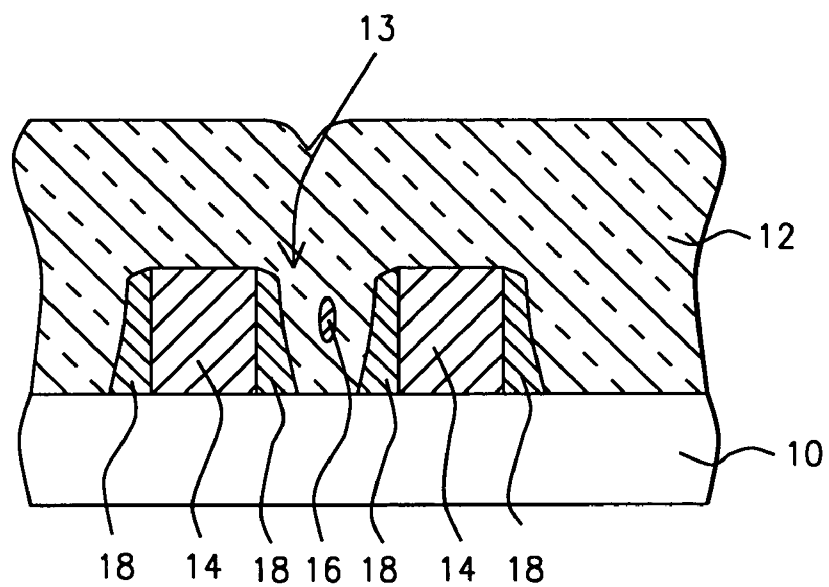
*FIG. 2 – Prior Art*

KEY-HOLE FREE PROCESS FOR HIGH ASPECT RATIO GAP FILLING WITH REENTRANT SPACER

BACKGROUND OF THE INVENTION (1) Field of the Invention

The invention relates to the field of semiconductor manufacturing, and more specifically to a method to completely and satisfactorily fill high aspect ratio gaps.

(2) Description of Prior Art

The conventional method of forming conducting lines and connecting vias within the construct of a semiconductor device is to deposit a layer of conducting material, such as aluminum, on the surface of a semiconductor using for instance a sputtering technique. Over this layer of conducting material is deposited a layer of photoresist, this photoresist is patterned and etched such that the conducting material that is to stay in place (to form the conducting lines or vias) is covered or protected by the photoresist. The unwanted conducting material is then removed, typically using anisotropic plasma etch. The openings created by the removal of the conducting material are filled with a dielectric material such as an oxide. The surface of the combined patterns of conductive material and dielectric can further be planarized by using a Chemical Mechanical Polishing (CMP) process that completes the creation of conducting lines or vias.

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

By combining bias sputtering deposition techniques with plasma-enhanced deposition, a high deposition rate has been established for CVD oxide. The deposited CVD oxide is free from particles from chamber walls and from metallic contamination and can furthermore produce films of low stress. Needed to accomplish this deposition however is a source of high density, low-energy ions. High-density plasma sources provide the capability to combine CVD $SiO_2$ and bias sputtering for high quality Intra-Layer Dielectric (ILD) at a low temperature.

Recent requirements for the creation of holes within deep layers of either conducting or other materials have resulted in creating openings that have aspect ratios in excess of 3. It is beyond the capability of the existing techniques to fill gaps of this aspect ratio with High Density Plasma-oxide (HDP-oxide). This lack of adequate filling of gaps also occurs for holes that have a reentrant spacer profile. A reentrant spacer profile is a profile where the walls of the openings are not vertical but are sloped, this sloping of the walls makes complete penetration of the HPD-oxide into the hole difficult and, under certain conditions, incomplete.

As a consequence of incomplete deposition of HDP-oxide into high aspect ratio holes, keyholes or deposition irregularities will be formed. These keyholes or deposition irregularities are characterized by non-homogeneous deposition that form in the deposited HDP-oxide.

FIG. 1 shows Prior Art deposition of HDP-oxide 12 over a pattern 14 of polysilicon. The pattern 14 can be deposited on the surface of a semiconductor substrate 10 or on any other surface within the formation of a semiconductor device. The resulting keyhole 16 appears within the hole 13 and is approximately centered within the hole. The keyhole is formed due to incomplete flow of the deposited HDP-oxide resulting in molecular tension and lack of uniform distribution of the deposited HDP-oxide.

FIG. 2 shows the same Prior Art phenomenon in the formation of the keyhole 16, in this example spacers 18 (for the SAC process) with a reentrant profile have been added to the polysilicon pattern 14. In the example shown in FIG. 2, the formation of the keyhole 16 can be more severe since the reason for the formation of the keyhole is further emphasized by the profile of the spacers 18. This profile shields portions of the holes between the poly pattern 14 from the source of the HDP-oxide deposition, this shielding further amplifies the formation of the keyhole 16.

The indicated condition for the formation of a keyhole can also occur where a high aspect ratio through-hole is formed by RIE and where the formation position of the through-hole may deviate from the correct position due to mask misalignment or a process variation. The created through-hole can in this case exhibit a profile that inhibits complete and uniform deposition of HDP-oxide.

The indicated existence of keyholes is, from a semiconductor manufacturing point of view, highly undesirable. Keyhole formation can be the cause of shorts between conducting layers, high leakage currents and unsatisfactory planarization characteristics. What is needed therefore is a method that eliminates the formation of keyholes. This method can solve the problem of keyhole formation by improving the filling of the holes or by reducing the aspect ratio of the hole or by improving the reentrant spacer profile. The present invention addresses the elimination of the keyhole by applying all three indicated problem solutions.

U.S. Pat. No. 5,814,564 (Yao) shows an etch back method to planarize an interlayer having a critical HDP-CVD deposition process.

U.S. Pat. No. 5,756,396 (Lee et al.) teaches full spacers on metal line sidewalls.

U.S. Pat. No. 5,262,352 (Woo) Method for forming an interconnection structure for conductive layers—shows a method for forming spacers on metal line sidewalls.

U.S. Pat. No. 5,462,893 (Matsuoka et al.) shows a spacer used as an etch stop on a metal line.

SUMMARY OF THE INVENTION

It is the primary objective of the invention to eliminate the formation of intra-space irregularities or keyholes within the Intra-Layer Dielectric of a pattern of conducting lines.

It is a further objective of the present invention to reduce leakage current within the pattern of conducting lines.

It is a further objective of the invention to enhance interlayer planarity within a semiconductor structure.

It is a further objective of the invention to reduce the aspect ratio of holes within a semiconductor structure.

It is a further objective of the invention is to improve the spacer profile of reentrant spacers within holes.

It is a further objective of the invention to reduce circuit failure and conduction layer shorts within a semiconductor structure.

In accordance with the objectives of the invention, a new method of depositing PE-oxide or PE-TEOS is achieved for use as an ILD within a conducting line pattern. An HDP-oxide is deposited over a pattern of polysilicon. A Buffered Oxide Etch (BOE) dip-back is performed on the surface of the deposited HDP-oxide leaving a layer of HDP-oxide on the bottom of the holes between the conducting lines in addition to leaving HDP-oxide on the top surface of the pattern of conducting lines. A layer of plasma-enhanced SiN is deposited. This PE-SiN is etched back leaving SiN spacers on the sidewalls of the poly pattern. The profile of the holes within the poly pattern is now such that the final layer of PE-oxide or PE-TEOS can be deposited without resulting in the formation of keyholes.

BRIEF DESCRIPTION OF THE DRAWINGS

FIG. 1 shows a cross section of a Prior Art deposition of a layer of HDP-oxide and the formation of keyholes within a poly pattern.

FIG. 2 shows a cross section of a Prior Art deposition of a layer of HDP-oxide and the formation of keyholes within a poly pattern whereby the poly pattern has spacers on the sidewalls of the pattern.

DESCRIPTION OF THE PREFERRED EMBODIMENT

Figure 3:
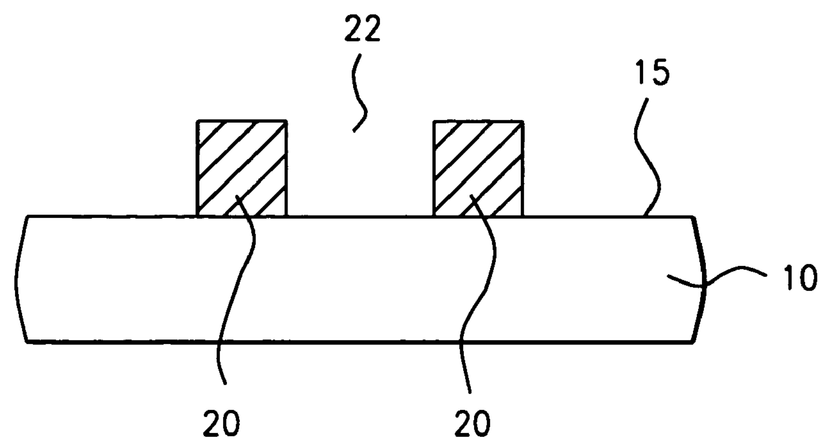
FIG. 3 shows a cross section of a polysilicon pattern.

Referring now specifically to FIG. 3, there is shown a pattern of polysilicon 20 deposited on top of a surface 15. The opening 22 is assumed to have an aspect ratio that is larger than 3.

The deposited poly 20 typically has a height of between 2 and 6K Angstrom, the width of pattern 22 typically is 0.2 um with a spacing between pattern openings of 0.3 um.

Figure 4:
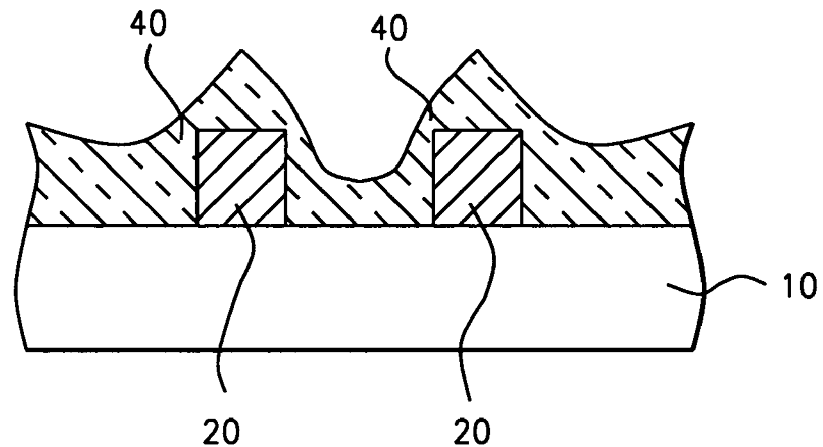
FIG. 4 shows a cross section of a polysilicon pattern over which a layer of HDP-oxide has been deposited.

FIG. 4 shows the deposition of a layer 40 of HDP-oxide over the pattern 20 of polysilicon. It is to be noted that the surface of the HDP-oxide layer 40 is not planarized at this time and is highly contoured by the profile of the underlying pattern 20 of polysilicon. This aspect of the invention is important since by maintaining the profile as shown the subsequent steps can form the desired spacers (which in turn prevent the formation of keyholes) and reduce the aspect ratio of the hole. For the non-SAC process, layer 20 contains only polysilicon, for the SAC process layer 20 contains a lower layer of polysilicon and a top layer (about 2000 Angstrom thick) of SiN. The HPD-oxide is deposited using HTP and LPCVD technology, to a thickness of between about 2 and 6K Angstrom.

Figure 5:
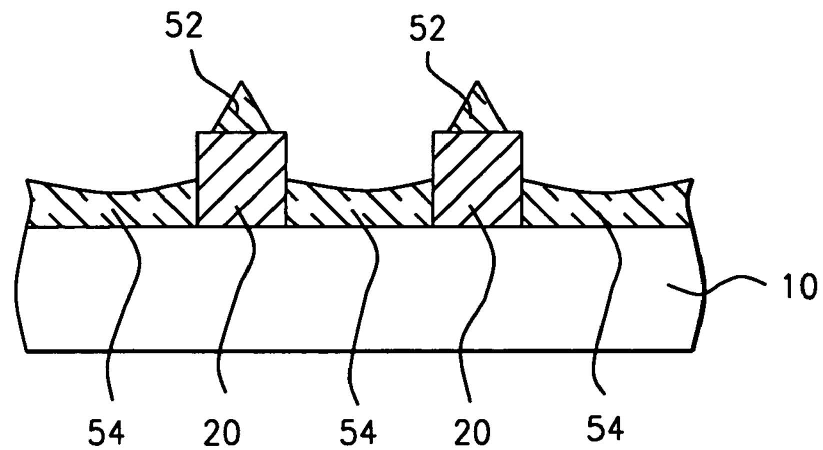
FIG. 5 shows a cross section after a Buffered Oxide Etch (BOE) dip back has been performed on the deposited layer of HDP-oxide.

FIG. 5 shows the results of a Buffered Oxide Etch dip-back. Of importance in this dip-back is the profile and amount 54 of the HDP-oxide that remains in place after this dip-back. The height of layer 54 of HDP-oxide is directly instrumental in reducing the aspect ratio of the hole between the poly pattern 20 because this layer 54 of HDP-oxide raises the bottom of the hole. The profile of the remaining HDP-oxide highlighted as 52 is instrumental in reducing the formation of the keyhole because this HDP-oxide enables or facilitates the penetration of the later to be deposited HDP-oxide into the hole. This HDP-oxide (52) urges the final layer of deposited PE-oxide or PE-TEOS into the hole and, in doing so, prevents the formation of the keyhole. The typical average thickness of layer 54 after completion of the etch back is about 4 K Angstrom. Layer 52 has a typical height of between 4 and 5 K Angstrom.

Figure 6:
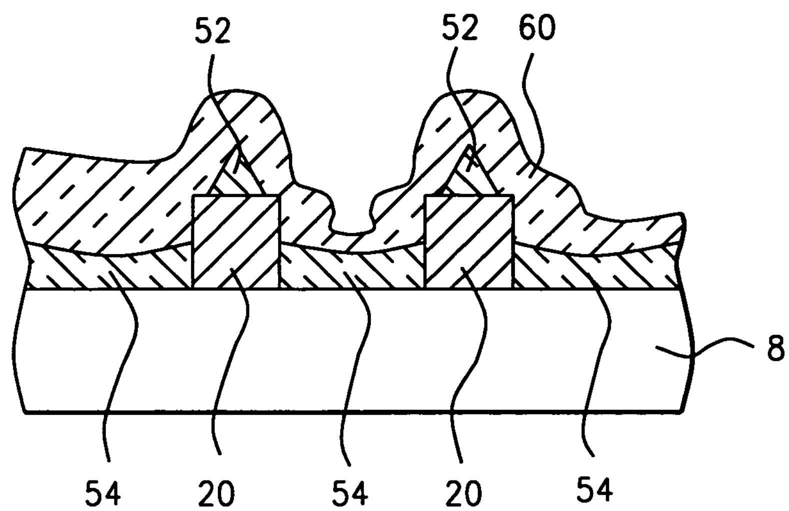
FIG. 6 shows a cross section of the polysilicon layer after a layer of SiN has been deposited over the etched back HDP-oxide.

FIG. 6 shows a cross section of the deposition of a layer 60 of SiN. This layer 60 of SiN forms the basis for the formation of the spacers on the sidewalls of the polysilicon pattern 20. The deposition of layer 60 uses PECVD technology, the layer is deposited at a temperature of about 400 degrees C. to a thickness between about 1000 and 2000 Angstrom.

Figure 7:
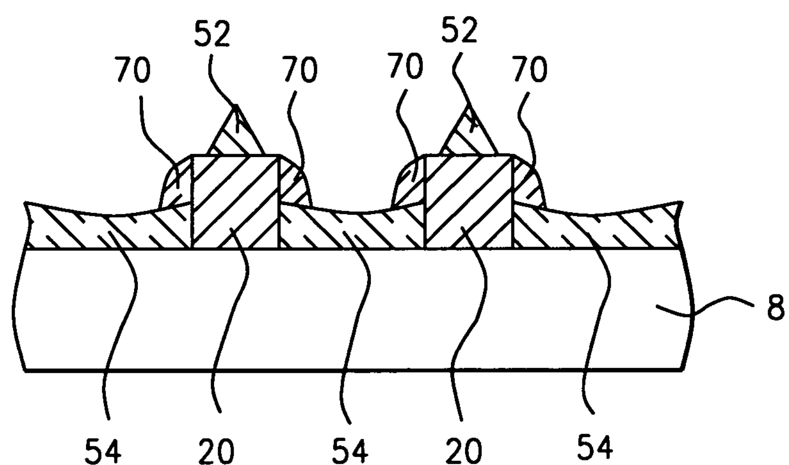
FIG. 7 shows a cross-section after SiN etch back of the deposited layer of SiN.

FIG. 7 shows a cross section of the poly pattern after the deposited layer (layer 60, FIG. 6) of SiN has been etched. This etching in effect forms the spacers 70 on the sidewalls of the poly pattern 20. These spacers 70 will further act to prevent the formation of the keyholes by virtue of their profile and by virtue of their presence. The profile of spacers 70 is such that the profile is curved facing away from the widewalls of the poly pattern. This curvature pushes the to be deposited HDP-oxide toward the center of the hole thus urging the deposition and formation of the HDP-oxide in this center. The HDP-oxide 52 that is on the top surface of the poly pattern performs the same function but performs this function at an earlier stage within the deposition process. Deposition 52 urges the deposited HDP-oxide towards the hole; spacers 70 pack the HDP-oxide inside the hole densely enough and at a rate such that no keyhole formation takes place.

The SiN layer typically is etched using $CHF_3$ at a flow rate of 15 sccm, with a gas pressure of 50 mTorr, an rf power density of 700 Watts, with no magnetic field applied, and an ambient wafer temperature of about 15 degrees C. End-point for the etch is an CO/CN end point signal.

Figure 8:
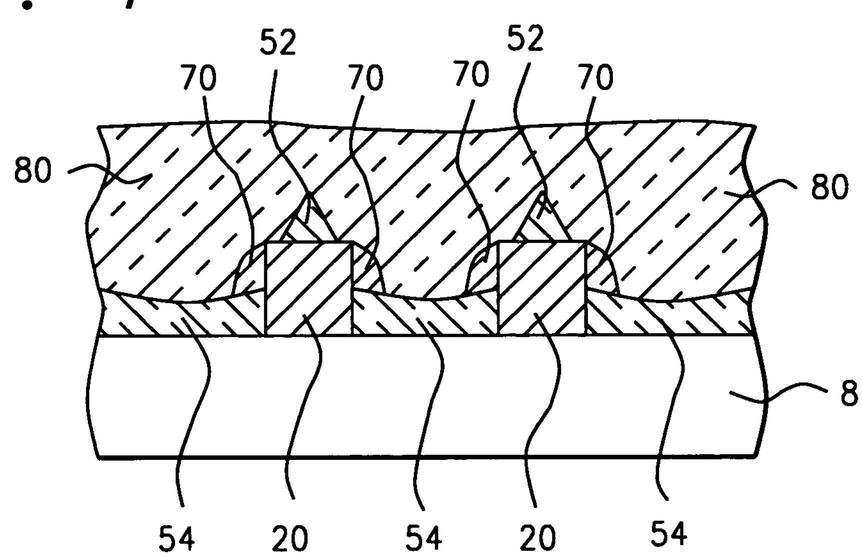
FIG. 8 shows a cross section of the polysilicon pattern after the deposition of the final layer of PE-oxide or PE-TEOS.

FIG. 8 shows the deposition of the final layer 80 of PE-TEOS or PE-oxide. Due to the formed spacers 70 and the formation of the previous depositions 52 of HDP-oxide, no keyholes will be formed. Layer 80 is typically deposited to a thickness of about 1 um.

While the present invention has been shown and described with reference to the preferred embodiment thereof, it will be understood by those skilled in the art of semiconductor manufacturing that the foregoing and other changes may be made therein without departing from the spirit and scope of the present invention.

What is claimed is:

1. A method of filling gaps between a pattern of interconnect lines forming a wiring structure on a semiconductor substrate, said interconnect lines having a top surface further having sidewalls, comprising the steps of:

providing a semiconductor substrate said substrate having a surface;

creating a network of interconnect lines on said surface of said substrate whereby said interconnect lines are separated by holes having bottoms between said interconnect lines thereby leaving said surface of said substrate partially exposed over said bottoms of said holes between said interconnect lines;

depositing a first layer of dielectric having a surface over said interconnect lines wiring structure thereby including said exposed surface of said semiconductor substrate;

performing an etch back of said first layer of dielectric thereby forming deposits of said first layer of dielectric on the top surface of the interconnect lines;

depositing a second layer of dielectric having a surface over said etched back first layer of dielectric;

etching said second layer of dielectric thereby creating exposed portions of said first layer of dielectric; and depositing a layer of oxide over said etched second layer of dielectric thereby including said exposed portions of said first layer of dielectric.

2. The method of claim 1 wherein said interconnect lines contain polysilicon.

3. The method of claim 1 wherein said interconnect lines contain a lower layer of polysilicon and an upper layer of silicon nitride (SIN) said wiring structure is applied during a SAC process.

4. The method of claim 1 wherein said interconnect lines contain an electrically conducting material.

5. The method of claim 1 wherein said first layer of dielectric contains High Density Plasma-oxide.

6. The method of claim 1 wherein said depositing said second layer of dielectric is depositing a layer of $Si_3N_4$ using PE-CVD technology at a temperature of about 400 degrees C. whereby said layer of $Si_3N_4$ is deposited to a thickness between about 1000 and 2000 Angstrom.

7. The method of claim 1 wherein said etching second layer of dielectric is etching $Si_3N_4$ using $CHF_3$ as etchant gas at a flow rate of about 15 sccm and a gas pressure of about 50 mTorr with an rf power density of about 700 watts with no magnetic field applied and an ambient wafer temperature of about 15 degrees C.

8. The method of claim 1 wherein said etch back of said first layer of dielectric is performing an etch back that is a Buffered Oxide based Etch said etch back to be performed on said first layer of dielectric thereby forming a layer of first dielectric having a surface on the bottom of the holes that separate said interconnect lines thereby further forming deposits of said first dielectric said deposits partially overlaying the top surfaces of said interconnect lines thereby creating partially exposed top corners of said interconnect lines said top corners being located at intersects between said sidewalls of said interconnect lines and said top surface of said interconnect lines.

9. The method of claim 8 wherein said depositing a second layer of dielectric is depositing a layer of silicon nitride ($Si_3N_4$) said deposition covering the surface of said layer of first dielectric on the bottom of said holes between said interconnect lines thereby further covering the surface of said first dielectric partially overlaying the top surfaces of said interconnect lines thereby furthermore covering the surface of said exposed top corners of said interconnect lines.

10. The method of claim 8 wherein said depositing a second layer of dielectric is depositing a layer of aluminum oxide ($A1_30_3$) said deposition covering the surface of said layer of first dielectric on the bottom of said holes separating said interconnect lines thereby further covering the surface of said first dielectric partially overlaying the top surfaces of said interconnect lines thereby furthermore covering the surface of the partially exposed top corners of said interconnect lines.

11. The method of claim 8 wherein said depositing a second layer of dielectric is depositing a layer of dielectric material said deposition covering the surface of said layer of first dielectric on the bottom of the holes separating said interconnect lines thereby further covering the surface of said first dielectric partially overlaying the top surfaces of said interconnect lines thereby furthermore covering surface of the partially exposed top corners of said interconnect lines.

12. The method of claim 1 wherein said etching said second layer of dielectric removing said second layer of dielectric in its totality except where said second layer of dielectric forms spacers on said sidewalls of said interconnect lines.

13. The method of claim 12 wherein said depositing a layer of oxide is depositing a layer of PE-oxide or PE-TEOS (Plasma Enhanced tetraethosiloxane) over said spacers on said sidewalls of said interconnect lines thereby furthermore depositing a layer of PE-oxide or PE-TEOS over said layer of first dielectric on the bottom of the holes between said interconnect lines thereby furthermore depositing a layer of PE-oxide or PE-TEOS over said first dielectric partially overlaying the top surfaces of said interconnect lines-thereby furthermore depositing a layer of PE-oxide or PE-TEOS over the partially exposed top corners of said interconnect lines.

14. The method of claim 13 with the additional step of planarizing said deposited layer of PE-oxide or PE-TEOS said planarization to proceed down to the plane of the top surface of said pattern of interconnect lines thereby completing the process of creating a high-aspect ratio pattern of interconnect lines said interconnect lines being separated with an Intra-Layer Dielectric.

15. A method of filling gaps between a pattern of interconnect lines forming a wiring structure on a semiconductor substrate, said interconnect lines having a top-surface further having sidewalls, comprising the steps of:

providing a semiconductor substrate said substrate having a surface;

creating a network of interconnect lines on said surface of said substrate whereby said interconnect lines are separated by holes having bottoms between said interconnect lines thereby leaving said surface of said substrate partially exposed over said bottoms of said holes between said interconnect lines;

depositing a first layer of dielectric having a surface over said interconnect lines wiring structure thereby including said exposed surface of said semiconductor substrate;

performing an etch back of said a first layer of dielectric wherein said etch back is performing a Buffered Oxide Etch thereby forming a layer of first dielectric on the bottom of said holes between said interconnect lines thereby further forming deposits of said first dielectric on the top surfaces of interconnect lines said deposits partially overlaying the top surfaces of said interconnect lines thereby creating exposed top corners of said interconnect lines said top corners being located at intersects between said sidewalls of said interconnect lines and said top surface of said interconnect lines;

depositing a second layer of dielectric said deposition covering said layer of first dielectric on the bottom of said holes between said interconnect lines thereby further covering said first dielectric partially overlaying the top surfaces of said interconnect lines thereby furthermore covering the partially exposed top corners of said interconnect lines;

etching said second layer of dielectric to remove said second layer of dielectric in its totality except where said second layer of dielectric forms spacers on the sidewalls of said interconnect lines; and depositing a layer of PE-oxide or PE-TEOS over said spacers on the sidewalls of said interconnect lines thereby furthermore depositing a layer of PE-oxide or PE-TEOS over said layer of first dielectric on the bottom of the holes between said interconnect lines thereby furthermore depositing a layer of PE-oxide or PE-TEOS over said first dielectric partially overlaying the top surfaces of said interconnect lines thereby furthermore depositing a layer of PE-oxide or PE-TEOS over the partially exposed top corners of said interconnect lines.

16. The method of claim 15 wherein said interconnect lines contain polysilicon.

17. The method of claim 15 wherein said interconnect lines contain a lower layer of polysilicon and a upper layer of silicon nitride (SiN) said interconnect lines is applied during a SAC process.

18. The method of claim 15 wherein said interconnect lines contain an electrically conducting material.

19. The method of claim 15 wherein said first layer of dielectric contains High Density Plasma-oxide.

20. The method of claim 15 wherein said depositing said second layer of dielectric is depositing a layer of $Si_3N_4$ using PE-CVD technology at a temperature of about 440 degrees C. whereby said layer of $Si_3N_4$ is deposited to a thickness between about 1000 and 2000 Angstrom.

21. The method of claim 15 wherein said depositing a second layer of dielectric is depositing a layer of aluminum oxide ($A1_30_3$).

22. The method of claim 15 wherein said depositing a second layer of dielectric is depositing a layer of dielectric material.

23. The method of claim 15 wherein said etching second layer of dielectric is etching $Si_3N_4$ using $CHF_3$ as etchant gas at a flow rate of about 15 sccm and a gas pressure of about 50 mTorr with an rf power density of about 700 watts with no magnetic field applied and an ambient wafer temperature of about 15 degrees C.

24. The method of claim 15 with the additional step of planarizing said deposited layer of PE-oxide or PE-TEOS said planarization to proceed down to the plane of the top surface of said pattern of interconnect lines thereby completing the process of creating a high-aspect ratio pattern of interconnect lines said interconnect lines being separated with an Intra-Layer Dielectric.

* * * * *